United States Patent
Gadat et al.

(10) Patent No.: US 9,432,054 B2
(45) Date of Patent: Aug. 30, 2016

(54) METHOD FOR DECODING A CORRECTING CODE WITH MESSAGE PASSING, IN PARTICULAR FOR DECODING LDPC CODES OR TURBO CODES

(71) Applicant: THALES, Neuilly-sur-Seine (FR)

(72) Inventors: Benjamin Gadat, Toulouse (FR); Nicholas Van Wambeke, Toulouse (FR)

(73) Assignee: Thales, Courbevoie (FR)

( * ) Notice: Subject to any disclaimer, the term of this patent is extended or adjusted under 35 U.S.C. 154(b) by 86 days.

(21) Appl. No.: 14/444,027

(22) Filed: Jul. 28, 2014

(65) Prior Publication Data
US 2015/0039959 A1   Feb. 5, 2015

(30) Foreign Application Priority Data
Aug. 2, 2013   (FR) ..................... 13 01859

(51) Int. Cl.
*H03M 13/00* (2006.01)
*H03M 13/11* (2006.01)
*H03M 13/29* (2006.01)

(52) U.S. Cl.
CPC ...... *H03M 13/1111* (2013.01); *H03M 13/1117* (2013.01); *H03M 13/2957* (2013.01)

(58) Field of Classification Search
CPC ................ H03M 13/1111; H03M 13/2957; H03M 13/1117
See application file for complete search history.

(56) References Cited

U.S. PATENT DOCUMENTS

| | | | | |
|---|---|---|---|---|
| 2005/0138520 A1* | 6/2005 | Richardson | ........ | H03M 13/1111 714/755 |
| 2007/0220394 A1* | 9/2007 | Kim | ................. | H03M 13/2975 714/753 |
| 2009/0296842 A1* | 12/2009 | Papadopoulos | ... | H04L 25/03216 375/260 |
| 2010/0088575 A1* | 4/2010 | Sharon | ................. | G06F 11/1072 714/763 |
| 2012/0005551 A1* | 1/2012 | Gunnam | ............ | H03M 13/1108 714/752 |

FOREIGN PATENT DOCUMENTS

| | | |
|---|---|---|
| EP | 1 959 572 A2 | 8/2008 |
| EP | 2501049 A1 | 9/2012 |
| WO | 20090156883 A1 | 12/2009 |

OTHER PUBLICATIONS

Sharon et al., "Efficient Serial Message-Passing Schedules for LDPC Decoding", IEEE Transactions on Information Theory, Nov. 2007, vol. 53, No. 11, pp. 4076-4091.

(Continued)

*Primary Examiner* — Bryce Bonzo
*Assistant Examiner* — Thien D Nguyen
(74) *Attorney, Agent, or Firm* — Baker & Hostetler LLP

(57) ABSTRACT

A method for iteratively decoding a word of a correcting code by an iterative decoding algorithm in the course of which, for each bit of said code word, at least one extrinsic information item is generated at each iteration, includes the following steps: an initial step of decoding by means of said iterative decoding algorithm; simultaneously, for each bit of said code word, a step of developing a criterion representing the number of oscillations of at least one extrinsic information item or of one extrinsic information item with regard to another extrinsic information item; if the decoding does not converge; a step of modifying the value of the bit of said code word for which said number of oscillations is highest; and, an additional step of decoding said at least one modified code word by means of said iterative decoding algorithm.

18 Claims, 4 Drawing Sheets

(56) References Cited

OTHER PUBLICATIONS

Sudan, "List Decoding: Algorithms and Applications", MIT Information Theory Online Repository, May 2000, pp. 1-19.
Varnica et al., "Augmented Belief Propagation Decoding of Low-Density Parity Check Codes", IEEE Transactions on Communication, Jul. 2007, vol. 55, No. 7, pp. 1308-1317.
Declercq et al., "Approaching Maximum Likelihood Decoding of Finite Length LDPC Codes via FAID Diversity", Information Theory Workshop (ITW), Sep. 2012 IEEE, pp. 487-491.
Ould-Cheikh-Mouhamedou et al., "A Method of Lowering Turbo Code Error Flare Using Correction Impulses and Repeated Decoding", 6th International ITG Conference on Source and Channel Coding (Turbocoding), 4th International Symposium, Apr. 2006, 5 pages.
Oberg et al., "Application of Distance Spectrum Analysis to Turbo Code Performance Improvement", Proc. 35th Annual Commun., Contorl and Computing, Sep. 1997, pp. 701-710.
Ryan et al., "Channel Code Classical and Modern", Table of Contents and Preface, Cambridge University Press, Oct. 2009, pp. i-xvi.

* cited by examiner

METHOD FOR DECODING A CORRECTING CODE WITH MESSAGE PASSING, IN PARTICULAR FOR DECODING LDPC CODES OR TURBO CODES

CROSS-REFERENCE TO RELATED APPLICATION

This application claims priority to foreign French patent application No. FR 1301859, filed on Aug. 2, 2013, the disclosure of which is incorporated by reference in its entirety.

FIELD OF THE INVENTION

The present invention relates to the field of digital telecommunications and more precisely to the field of channel encoding, which concerns the use of correcting codes with the aim of increasing the level of redundancy of the transmitted information so as to be able to reconstruct the initially generated message despite the errors introduced during the transmission of this message over an imperfect propagation channel.

The invention relates in particular to a method for improved decoding of a correcting code applicable to decoding algorithms with message passing. The invention can advantageously be applied to LDPC ("Low Density Parity Check") codes and to turbo codes but also to any other correcting code that can be represented via a parity matrix and that can be iteratively decoded by means of a message-passing algorithm in the course of which extrinsic information items are generated, for each bit to be decoded, with the aim of improving the reliability of the decisions in the course of the iterations.

BACKGROUND

The families of correcting codes that can be decoded iteratively are particular families of channel encoding that notably comprise LDPC codes and turbo codes. Hereinafter the expression "codes of the turbo family" will be used to denote all the correcting codes that can be represented by a parity matrix and that can be decoded iteratively by means of a message-passing algorithm.

These codes make it possible to obtain a good performance in terms of packet or bit error rate as a function of the signal-to-noise ratio, but do have two major drawbacks.

Firstly, the performance of these codes has a floor below which the error rate no longer decreases despite an increase in the signal-to-noise ratio at reception. This phenomenon is known in the field by the name "error floor".

Secondly, the performance of these codes is substantially degraded for small packet sizes (typically of 100 to 500 bits). Indeed, even if these code families are known for making it possible to asymptotically approach the theoretical channel capacity in the sense of Shannon's theorem, the difference with respect to the capacity actually achieved, for small packet sizes, is often considerable.

A first known solution for improving the performance of codes of the turbo family consists in supplementing it with an external code, of BCH code or Reed-Solomon code type, to form a concatenated encoding scheme. This method, although effective in performance terms, has the drawback of decreasing the useful throughput of the transmission.

A second known solution, described in reference consists in analysing the spectrum of the code words in order to identify the least protected bits in the frame produced at the decoding input. Indeed, for such codes, not all the bits are equally protected and the effect of an error on a given bit is therefore not the same as that of an error on another bit. Once the set $\Omega$ of these bits has been determined, a turbo encoder inserts known bits at the positions signified by the set $\Omega$. As a consequence, upon decoding, the set $\Omega$ and the values of the inserted bits being known, a considerable level of reliability is declared at the input of the turbo-decoder in order to improve the performance thereof. The inserted bits are then withdrawn at the output of the turbo-decoder in order to retrieve the initial information frame.

Again, this technique has the drawback of decreasing the effective yield of the code since information bits are removed and replaced by bits of known values.

A third solution, proposed in [3], consists in introducing pulses at certain positions of the input frame of the decoder. These positions are determined on the basis of the likelihood information of the bits at the decoder input. The likelihoods are sorted only according to their magnitude and the pulses are introduced one by one into the frame, starting with the least reliable likelihoods.

This method is effective, but its main flaw is that it is very complex to implement. Indeed, it appears effective for a large number of positions and is based on the principle that all the bits in the frame have the same importance, which is not the case for a code of the turbo family.

A fourth solution, described in reference [4], consists in modifying the decision rules of the decoder in order to take advantage of the diversity of the decoder.

This method only works for LDPC codes and not for other codes of the same family. Moreover it requires a complex parameterization of the decoder.

Finally, the solution described in [5], which consists in attempting to identify a certain number of erroneous nodes in the graph of the decoder in order to carry out several decoding passes, is also known. However, this method has a high degree of complexity because the proposed algorithm requires the preservation of all the messages exchanged by the decoder in the course of the various decoding attempts. Furthermore, the method described in [5] is only compatible with a particular type of decoding algorithm and only works with soft input values.

SUMMARY OF THE INVENTION

In order to remedy the aforementioned limitations of the known solutions, the present invention proposes an iterative decoding method that makes it possible to approach the performance of maximum likelihood decoding.

The method according to the invention is based on the identification, at the decoder input, of the least reliable bits on the basis of the sign changes of the extrinsic information items exchanged in the course of the iterative decoding, the decoding algorithm employed being of "message passing" type, i.e., for each bit to be decoded, an extrinsic information item is generated at each decoding iteration with the aim of improving the reliability of the decoding decision.

The subject of the invention is thus a method for iteratively decoding a word of a correcting code by means of an iterative decoding algorithm in the course of which, for each bit of said code word, at least one extrinsic information item is generated at each iteration, said method being characterized in that it includes the following steps:

an initial step of decoding by means of said iterative decoding algorithm, simultaneously with said iterative decoding, for each bit of said code word, a step of developing a criterion representing the number of oscillations, in the course of the successive decoding iterations, of at least one extrinsic information item or of one extrinsic information item with regard to another extrinsic information item, if the decoding does not converge, a step of modifying the value of the bit of said code word for which said number of oscillations is highest, to produce at least one modified code word, an additional step of decoding said at least one modified code word by means of said iterative decoding algorithm.

According to a particular aspect of the invention, the step of modifying the value of one bit of the code word and of decoding the modified code word are iterated while modifying, at each iteration, the value of the bit of said code word for which said number of oscillations is highest among the bits whose value has not been modified in a previous iteration.

According to a particular aspect of the invention, simultaneously with the additional decoding step, for each bit of said code word, a new step of developing a criterion representing the number of oscillations, in the course of the successive decoding iterations, of at least one extrinsic information item or of one extrinsic information item with regard to another extrinsic information item, is carried out, the step of modifying the value of one bit of the code word and of decoding the modified code word are iterated while:
i. preserving the modification or modifications of bit values effected in the previous iterations, and
ii. modifying the value of the bit of said code word for which said number of oscillations is highest in the additional decoding step carried out in the previous iteration.

According to a particular aspect of the invention, the iterations of the steps of modifying the value of one bit of the code word and of decoding the modified code word are stopped at the end of a given number of iterations.

According to a particular aspect of the invention, the iterations of the steps of modifying the value of one bit of the code word and of decoding the modified code word are stopped as soon as the decoder converges.

According to a particular aspect of the invention, when the decoder converges, the decoded word is saved in a list, the iterations of the steps of modifying the value of one bit of the code word and of decoding the modified code word being stopped as soon as the list reaches a predetermined number of elements.

According to a particular aspect of the invention, the method furthermore comprises a step of computing, for each element in the list of the decoded words, a criterion of likelihood and selection of the decoded word that optimizes said likelihood criterion.

According to a particular aspect of the invention, said iterative decoding algorithm includes the use of a bipartite graph, called a Tanner graph, comprising a plurality of first nodes, called variable nodes, each variable node being associated with one bit of said code word, said graph furthermore comprising a plurality of second nodes, called check nodes, each variable node being connected to at least one check node to receive an extrinsic information item from said check node, said criterion representing the number of oscillations being chosen to be equal to the number of sign changes, in the course of the successive decoding iterations, of an extrinsic information item received by a variable node originating from a check node.

According to a particular aspect of the invention, the counting of the number of sign changes of an extrinsic information item is carried out on all the extrinsic information items received by a variable node originating from a check node.

According to a particular aspect of the invention, a global extrinsic information item is computed on the basis of all the extrinsic information items received by a variable node originating from a check node and the counting of the number of sign changes of an extrinsic information item is carried out on the global extrinsic information item.

According to a particular aspect of the invention, said correcting code is an LDPC code.

According to a particular aspect of the invention, said correcting code is a turbo code, said iterative decoding algorithm includes the use of a first decoder and of a second decoder capable of exchanging with each other a first extrinsic information item and a second extrinsic information item, said criterion representing the number of oscillations being chosen to be equal to the number of sign changes, in the course of the successive iterations of said iterative decoding algorithm, of the extrinsic information item received by the second decoder or to the number of sign changes, in the course of the successive iterations of said iterative decoding algorithm, of the extrinsic information item received by the second decoder and of the extrinsic information item received by the first decoder or to the number of sign differences, in the course of the successive iterations of said iterative decoding algorithm, between the extrinsic information item received by the second decoder and the extrinsic information item received by the first decoder in the course of one iteration or one half-iteration.

According to a particular aspect of the invention, said code word contains binary values and said step of modifying the value of one bit of said code word consists in inverting the value of said bit.

According to another particular aspect of the invention, said code word contains soft values and said step of modifying the value of one bit of said code word consists in saturating the value of said bit to a positive maximum saturation value and to a negative minimum saturation value respectively, so as to produce two modified code words.

According to a particular aspect of the invention, the iterations of the steps of modifying the value of one bit of the code word and of decoding the modified code word are represented in the form of a tree whose nodes each correspond to a decoding iteration associated with one of the two saturation values from among the positive maximum value and the negative minimum value, said tree being traversed either width-wise or depth-wise.

According to a particular aspect of the invention, when the decoding iteration associated with a node of said tree has converged, the child nodes of said node are not traversed.

Another subject of the invention is a system for receiving communications comprising means adapted for executing the steps of the iterative decoding method according to the invention, a computer program including instructions for executing the iterative decoding method according to the invention, when the program is executed by a processor, and a storage medium readable by a processor on which a program is stored including instructions for executing the iterative decoding method according to the invention, when the program is executed by a processor.

BRIEF DESCRIPTION OF THE DRAWINGS

Other features and advantages of the present invention will become more apparent upon reading the following description, with reference to the appended drawings which represent.

DETAILED DESCRIPTION

Figure 1:
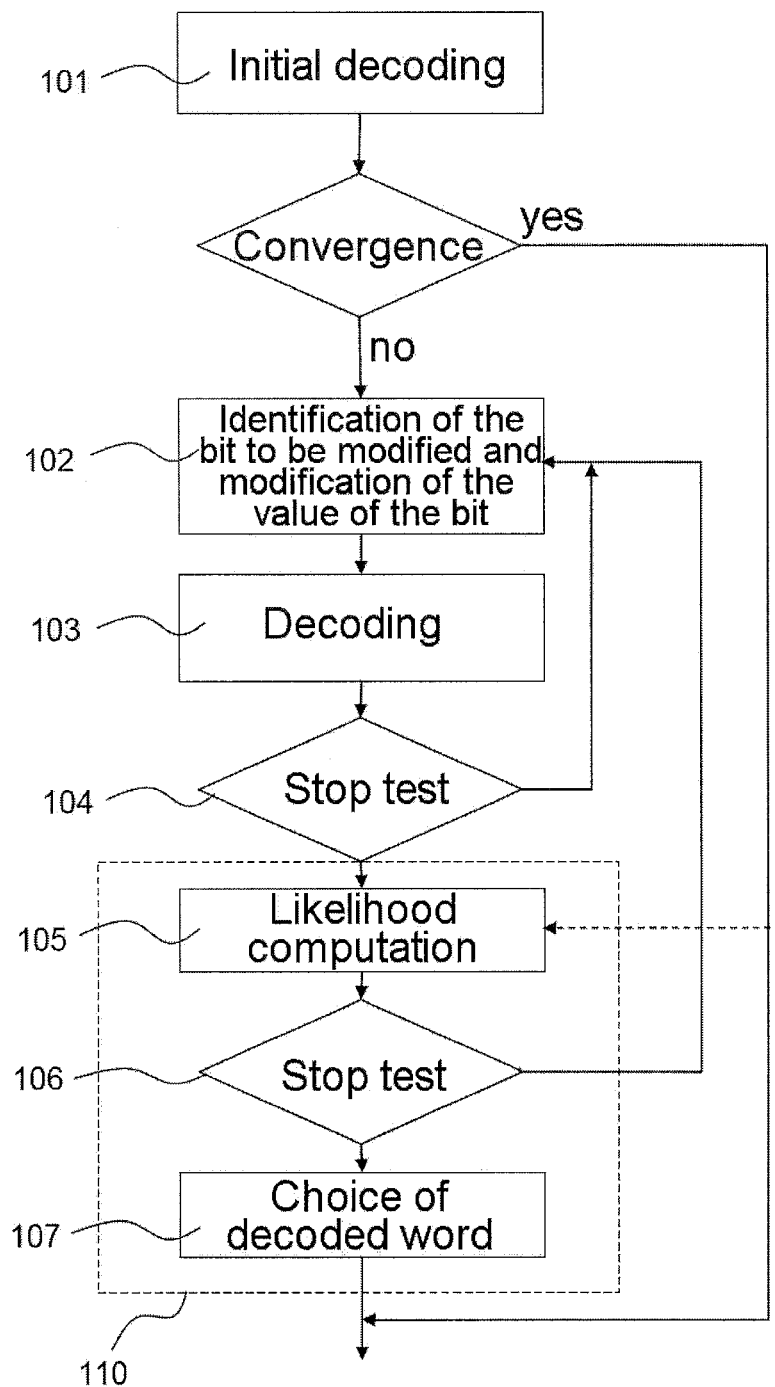
FIG. 1, a flow chart describing the steps of implementing the method according to the invention, FIG. 2, a diagram illustrating the representation of a correcting code of LDPC type by means of a Tanner graph, FIGS. 3a and 3b, two diagrams illustrating, in a particular step of the method, the use of a tree and its traversal according to two different embodiments of the invention, FIG. 4, a diagram illustrating the exchanges of extrinsic information items during the decoding of a turbo code.

FIG. 1 describes, in a flow chart, the sequence of steps for implementing the method according to the invention for decoding a code word of a given correcting code.

Firstly, a first embodiment of the invention adapted for decoding LDPC codes will be described.

In a preliminary step 101, a first instance of decoding is executed for decoding the code word. According to a first embodiment of the invention, the decoding algorithm used is based on the employment of a bipartite graph, called a Tanner graph. Such a graph is notably adapted for decoding LDPC codes.

The reference text [1], and in particular Chapter 5 entitled "Low-density parity-check codes", describes in detail the use of a Tanner graph for decoding an LDPC code and various decoding algorithms based on such a graph (in particular the sum-product algorithm). The decoding algorithm used in the preliminary step 101 of the method according to the invention can be one of those described in Chapter 5 of said text or any other equivalent algorithm on the condition that it is based on a bipartite Tanner graph. Such an algorithm will not be described in detail in the present document because those skilled in the art, expert in correcting codes, will be able to refer to the text [1] or any other reference text in the field to implement this algorithm.

A Tanner graph is a bipartite graph composed of two types of nodes. A first type of node is called variable node or else code-bit node according to custom. The variable nodes are each associated with one bit of the code word produced at the input of the decoding algorithm. There are therefore as many variable nodes as bits in the code word to be decoded. Each variable node is connected to one or more check nodes or constraint nodes. The number of check nodes is equal to the number of rows of the parity matrix of the correcting code. A check node of index i is connected to a variable node of index j if and only if the element of the row i and of the column j of the parity matrix of the code is equal to 1.

Figure 2:
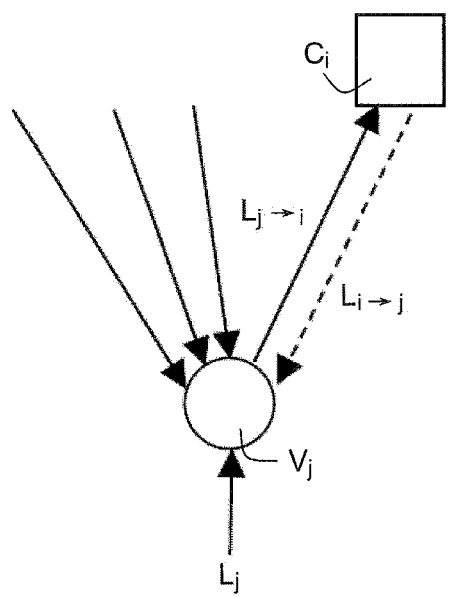

FIG. 2 represents a portion of a Tanner graph comprising a variable node $V_j$ and a check node $C_i$ linked to each other. On the example in FIG. 2, the variable node $V_j$ is also connected to three other check nodes. The variable node $V_j$ is initialized with the value $L_j$ of the bit of index j of the code word received at the input of the algorithm. This value can be binary but is most often a so-called soft value equal to the logarithm-likelihood ratio LLR. At each iteration of the decoding algorithm, the variable node $V_j$ transmits an extrinsic information item $L_{j \rightarrow i}$ to the check nodes to which it is connected and receives an extrinsic information item $L_{i \rightarrow j}$ from the check nodes to which it is connected.

The concept of extrinsic information item is well-known in the field and is for example explained in the reference text [1], Chapter 5. It can be equal to an information item of the logarithm-likelihood ratio type. The likelihood ratio is defined by the ratio of the probability of having one bit at 0 knowing the received code word and the probability of having one bit at 1 knowing the received code word.

Simultaneously with the decoding and for each variable node associated with each bit of the code word to be decoded, the number of sign changes of the extrinsic information item received by the variable node is recorded and saved until the end of the decoding.

The number of sign changes can be counted over all of the extrinsic information items received by the variable node, originating from all the check nodes to which it is connected or by computing beforehand a global extrinsic information item equal to the sum of the received extrinsic information items then by counting the number of sign changes of the global extrinsic information item.

At the end of the decoding, there is therefore, for each decoded bit, an associated item of information about the number of sign changes of the extrinsic information item received by the variable node associated with this bit.

This information item gives an indication of the reliability of the decoded bit and is used, hereinafter, for improving the decoding by carrying out one or more successive decoding passes.

If the decoding carried out in the preliminary step 101 converges, then the decoded word obtained is retained and the process is stopped. In a variant embodiment, the decoded word is added to a list of several decoded words from which the most likely word will be chosen, according to a criterion described in more detail hereinafter.

The criterion of convergence used can be any usual criterion, in particular this criterion can consist of a check of a CRC code supplementing the received code word, a syndrome detection, or any other criterion making it possible to define a convergence of the decoding algorithm.

If the decoding carried out in the preliminary step 101 does not converge, then, in a new step 102 of the method according to the invention, in the code word produced at the input of the decoding algorithm, the bit is identified that corresponds to the variable node of the Tanner graph for which the number of sign changes of the received extrinsic information item is highest. The value of the identified bit is then modified in order to produce a modified code word.

The modification effected on the identified bit differs according to whether the code word produced at the input of the method is binary or is composed of soft values. In the first case, the value of the bit is modified by inverting the identified bit, i.e. by modifying its value from 0 to 1 or from 1 to 0. In the second case, the value of the bit is saturated at the maximum and minimum possible values according to the range of variation of the soft values. For example, if a soft value is quantified to vary between the terminals −S and +S, where S is a positive number, then the modification of the identified bit consists in saturating the value of this bit respectively at the value +S and at the value −S so as to produce two modified code words.

This modification makes it possible to assist the decoder by making a prior decision on the bit identified as poorly reliable due to the many sign changes of the associated extrinsic information item, which are an expression of instability in the decision-making of the decoder.

In a following step 103, the decoding method is repeated, using the same decoding algorithm as in the preliminary step 101 but applying it to the modified code word. In the case where two modified code words are produced, the step 103 consists in executing the decoding algorithm on these two words in alternation.

The steps 102 and 103 are iterated several times until a stop test 104 is verified.

Several variant embodiments of the iterations of the steps 102, 103, 104 will now be described.

In a first variant, at each iteration, the value of the bit of the code word associated with the variable node for which the number of sign changes of the received extrinsic information item is highest, among the bits whose value has not been modified at a previous iteration, is modified.

In other words, the bits of the code word are sorted in decreasing order of the associated number of sign changes, then the decoding 103 is executed while modifying, at each iteration, the value of the following bit, in the predefined decreasing order. At each new iteration, the code word is reset before modifying the value of a single one of its bits.

This variant has the advantage of having low complexity because it only requires a single count of the sign changes in the initial decoding pass.

In a second variant, at each decoding iteration 103, a new count of the number of sign changes of the extrinsic information item received by each variable node, in the course of the decoding 103, is carried out and, in the code word modified in the previous iteration, the value of the bit associated with the variable node for which the number of sign changes is highest is modified.

This second variant has the advantage of an improvement in decoding performance because the decision assistance, in the form of modification of the bits of the code word, is refined by successive iterations.

Figure 3A:
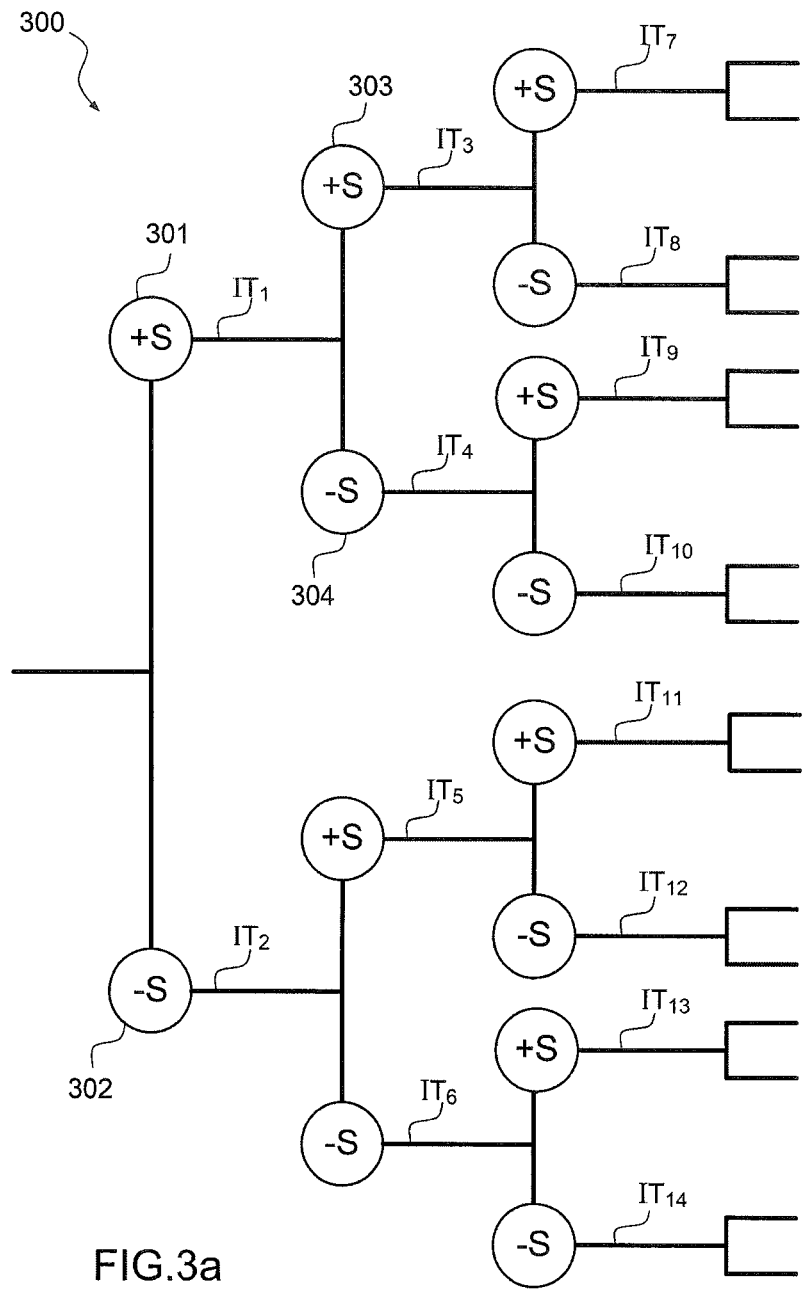
Figure 3B:
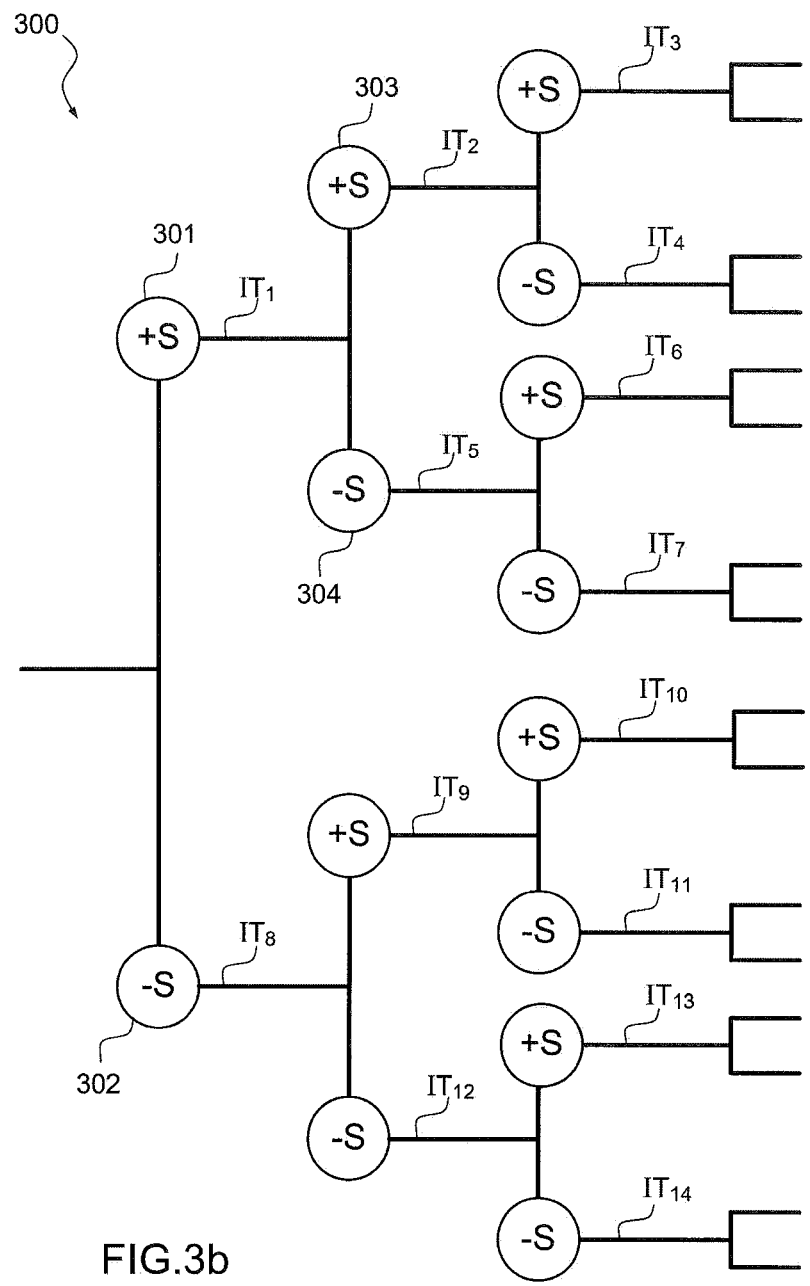

In this second variant and in the case where the code word includes soft values, the decoding iterations 103 can be represented in the form of a tree as illustrated in FIGS. 3a and 3b.

In such a tree 300, the nodes 301, 302, 303, 304 of the tree each correspond to one decoding iteration associated with one of the two saturation values −S, +S of the modified bit.

The tree 300 can first be traversed width-wise, as illustrated in FIG. 3a. In this case, the first decoding iteration IT1 is applied to the initial code word modified with the positive saturation value +S, then the second decoding iteration IT2 is applied to the initial code word modified with the negative saturation value −S. Next, the second depth level of the tree is traversed. In other words, the third decoding iteration IT3 is applied to the code word modified at the first iteration modified with the positive saturation value +S, the fourth decoding iteration IT4 is applied to the code word modified at the first iteration modified with the negative saturation value −S, the fifth decoding iteration IT5 is applied to the code word modified at the second iteration modified with the positive saturation value +S, the sixth decoding iteration IT6 is applied to the code word modified at the second iteration modified with the negative saturation value −S. The following depth levels of the tree are traversed in the same way. At each iteration, the code word modified in the preceding step is preserved and the value of the bit associated with the variable node for which the number of sign changes of the received extrinsic information item is highest is modified.

The number of depth levels, in other words the maximum number of iterations, is set a priori.

FIG. 3b represents the same tree but illustrates a traversal of the tree that is depth-wise, and not width-wise as in FIG. 3a.

In the variant represented in FIG. 3b, the tree is traversed by testing on the one hand the child nodes of the node 301 corresponding to the initial code word modified with the positive saturation value +S and on the other hand the child nodes of the node 302 corresponding to the initial code word modified with the negative saturation value −S.

This variant offers the advantage of being able to perform the decoding iterations in parallel while simultaneously carrying out the iterations resulting from the node 301 and those resulting from the node 302.

Whatever the method of traversal of the tree, in another variant embodiment, the tree can be pruned by eliminating the child nodes of a node corresponding to an iteration that has resulted in the convergence of the decoder. Indeed, if the decoder converges, the probability of finding another, more likely candidate for the decoded word among the child nodes is infinitely small. The pruning of the tree makes it possible to decrease its complexity by removing useless decoding iterations.

The stop test 104 used for stopping the decoding iterations 103 can take several forms.

In a first variant, the iterations 102, 103 are stopped as soon as the decoder converges.

In a second variant, the iterations 102, 103 are stopped at the end of a predetermined number of iterations, for example corresponding to a degree of depth of the tree 300.

In a variant embodiment of the invention, a group 110 of additional steps is executed before determining the retained decoded word.

In a first step 105 of this group 110, the decoded words obtained at the end of the stop test 104 or at the end of the first initial decoding pass 101, in the case where the decoder has converged, are stored in a list of candidate decoded words. This list has a predetermined size, for example equal to a maximum of three candidates.

For each candidate in the list, a criterion of likelihood of the decoded word is computed.

When 106 the number of candidate words is equal to the maximum number of words in the list, the candidate that makes it possible to optimize the likelihood criterion is chosen 107.

These additional steps 105, 106, 107 make it possible to further improve the decoding performance by selecting the most likely decoded word from among several candidates.

The likelihood criterion used depends on the nature of the code word at the decoder input.

If the code word contains binary data, the criterion can consist in pair-wise summation of the products of the modulated received bit (i.e. that can take the values +1 or −1) at the decoder input and the modulated decided bit of the candidate decoded word then in selecting the candidate decoded word that maximizes this criterion.

If the code word contains soft data, the criterion can consist in pair-wise summation of the products of the likelihood of the bit received at the decoder input and the modulated decided bit of the candidate decoded word then in selecting the candidate decoded word that maximizes this criterion.

Any other equivalent likelihood criteria, known in the field of algorithms for decoding correcting codes, can be used instead and in place of the two aforementioned criteria.

According to a second embodiment of the invention, the decoding method can also apply to turbo codes.

In this case the decoding algorithm used to execute the steps 101 and 103 of the method according to the invention is no longer based on the use of a Tanner graph but on iterative decoding with exchanges of extrinsic information items between two decoders.

Figure 4:
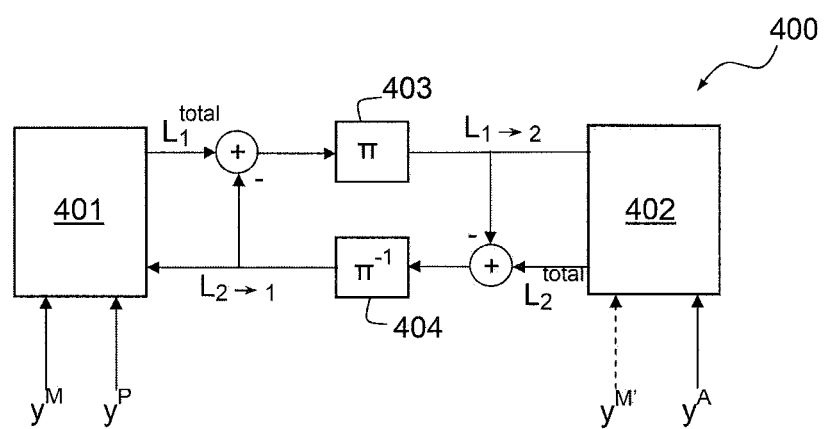

FIG. 4 schematizes the operation of a decoder adapted for decoding turbo codes.

Such a decoder 400 notably includes a first unitary decoder 401 of a first correcting code and a second unitary decoder 402 of a second correcting code linked to each other by a first and a second interleaver 403, 404.

The detailed operation of such a decoder 400 is known in the field and notably described in Chapter 7 of reference text [1]. It is not the subject of the invention and will therefore not be described in detail in the present patent application.

In summary, the decoder 400 operates iteratively according to the following principle. For each bit of the code word to be decoded, the first unitary decoder 401 is executed and makes it possible to generate a first extrinsic information item $L_{1->2}$ which is transmitted to the second unitary decoder 402, which in turn makes use of this information item to decode the code word, and generate a second extrinsic information item $L_{2->1}$. This second information item is retransmitted to the first decoder 401 with the aim of executing a new iteration of the decoder 400. The process is continued with several successive iterations. At the end of the last iteration, a decision is made by the second unitary decoder 402 to obtain the decoded word.

The extrinsic information items exchanged between the two unitary decoders, for each bit of the code word, are of the same nature as the extrinsic information items exchanged between the nodes of a bipartite Tanner graph.

Thus, to apply the method according to the invention to the decoding of a turbo code, it suffices to replace the extrinsic information item received by a variable node in the course of the decoding of a LDPC code, by an extrinsic information item exchanged between the two unitary decoders 401, 402 in the course of the decoding of a turbo code.

On this subject, several variant embodiments are possible.

In a first variant, only the extrinsic information item $L_{1->2}$ received by the second decoder 402 is taken into account for the counting of the number of sign changes as described previously for the case of LDPC codes. The sign changes are counted upon the successive decoding iterations.

Indeed, since the making of a decision related to the decoding is in fine performed by the second decoder 402, the sign changes of the extrinsic information item received by the latter give an indication of the reliability of the associated decoded bit. If many oscillations have taken place upon the various successive decoding iterations, this indicates an instability of the decision related to the value of the decoded bit. In other words, the more oscillations of the extrinsic information item there are, the more uncertain the actual value of the bit.

In a second variant, the counting of the number of sign changes can take into account both the extrinsic information item $L_{1->2}$ received by the second decoder 402 and the extrinsic information item $L_{2->1}$ received by the first decoder 401.

In a third variant, the counting of the number of sign changes can be replaced by the counting of the number of times when, in the course of the successive decoding iterations, the signs of the extrinsic information item $L_{1->2}$ received by the second decoder 402 and the extrinsic information item $L_{2->1}$ received by the first decoder 401 are opposite. Indeed, when, for one and the same bit, the signs of the extrinsic information items exchanged by the two decoders in one half-iteration are opposite, this is also indicative of an oscillation in the making of a decision on the value of the decoded bit.

More generally, the criterion related to the number of sign changes of an extrinsic information item exchanged in the course of the decoding iterations or to the number of sign differences between two extrinsic information items can be replaced by any equivalent criterion that represents the oscillations of one or more extrinsic information items or of one extrinsic information item with regard to another. Thus, to apply the method according to the invention to the decoding of another type of correcting code using another type of message-passing algorithm than those described in the two aforementioned examples, those skilled in the art will know how to adapt the criterion to be used to the intrinsic operation of the decoder used to develop an equivalent criterion.

The decoding method according to the invention can be implemented on the basis of hardware and/or software elements. It can notably be implemented as a computer program including instructions for its execution. The computer program can be stored on a storage medium readable by a processor.

It can be used in a context of transmission of a stream of encoded data between an emitter and a receiver, the method according to the invention being implemented by the receiver.

It can also be executed on the basis of a stream of data encoded and stored in a storage device.

The various steps of the method according to the invention can also be executed by a device comprising a processor and a memory. The processor can be a generic processor, a specific processor, an ASIC (Application-Specific Integrated Circuit) or an FPGA (Field-Programmable Gate Array).

REFERENCES

[1] "Channel codes, classical and modern", William E. Ryan, Shu Lin, Cambridge University Press.
[2] M. Oberg & P. Siegel, "Application of distance spectrum analysis to turbo code performance improvement", Proc. $35^{th}$ Annu. Conf. Commun, Control and Computing. pp 701-710, Sept 1997.
[3] Y. Ould-Cheikh-Mouhamedou, "A Method for Lowering Turbo Code Error Flare using Correction Impulses and Repeated Decoding", $6^{th}$ international ITG-Conference on Source and Channel Coding (Turbocoding), 2006 $4^{th}$ international symposium
[4] "Approaching Maximum Likelihood decoding of finite length LDPC codes via FAID diversity", D. Declercq et al.
[5] "Augmented Belief Propagation Decoding of Low-Density Parity Check Codes", Varnica et al. IEEE Trans on Com 2007.

The invention claimed is:

1. A method for iteratively decoding a code word of a correcting code by an iterative decoding algorithm, which for each bit of said code word, at least one extrinsic information item is generated at each iteration, said method including the following steps:
   performing, at a decoding device, an initial step of decoding based upon said iterative decoding algorithm,
   simultaneously with executing said iterative decoding algorithm, for each bit of said code word, producing, at the decoding device, a criterion representing a number of oscillations, during all successive iterations of said iterative decoding algorithm, of at least one extrinsic information item or of one extrinsic information item with regard to another extrinsic information item, if the iterative decoding does not converge,
modifying, at the decoding device, in said code word, only a value of the bit for which said number of oscillations is highest, to produce at least one modified code word,
performing, at the decoding device, an additional decoding of said at least one modified code word based upon said iterative decoding algorithm, and
outputting, at the decoding device, a decoded code word.

2. The method according to claim 1, in which the modifying includes modifying a value of one bit of the code word and the decoding the modified code word are iterated while modifying, at each iteration, the value of the bit of said code word for which said number of oscillations is highest among bits whose values have not been modified in a previous iteration.

3. The method according to claim 1, in which:
simultaneously with the additional decoding step, for said each bit of said code word, producing a criterion representing a number of oscillations, during all successive decoding iterations, of at least one extrinsic information item or of one extrinsic information item with regard to another extrinsic information item,
the modifying a value of one bit of the code word and the decoding the modified code word are iterated while:
  i. preserving a modification or modifications of bit values resulting from previous iterations, and
  ii. modifying the value of the one bit of said code word for which said number of oscillations is highest in the additional decoding step carried out in a previous iteration.

4. The method according to claim 2, in which the iterations of the modifying a value of one bit of the code word and of the decoding the modified code word are stopped at an end of a given number of iterations.

5. The method according to claim 2, in which the iterations of the modifying a value of one bit of the code word and of the decoding the modified code word are stopped as soon as the iterative decoding converges.

6. The method according to claim 2, in which, when the iterative decoding converges to output the decoded code word, the decoded code word is saved in a list of decoded code words, the iterations of the modifying a value of one bit of the code word and of decoding the modified code word being stopped as soon as the list reaches a predetermined number of elements.

7. The method according to claim 6, further comprising:
computing, at the processor, for each element in the list of the decoded code words, a likelihood criterion, and
selecting, at the processor, the decoded code word that optimizes said likelihood criterion.

8. The method according to claim 1, in which said iterative decoding algorithm includes using a bipartite graph, being a Tanner graph, comprising a plurality of first nodes, being variable nodes, each variable node being associated with one bit of said code word, said Tanner graph further comprising a plurality of second nodes, being check nodes, each variable node being connected to at least one check node to receive an extrinsic information item from said check node, said criterion representing the number of oscillations being chosen to be equal to a number of sign changes during all the successive decoding iterations, of an extrinsic information item received by a variable node in the variable nodes originating from a check node in the check nodes.

9. The method according to claim 8, wherein a counting of the number of sign changes of an extrinsic information item is carried out on all the extrinsic information items received by the variable node originating from the check node.

10. The method according to claim 8, wherein a global extrinsic information item is computed based on all the extrinsic information items received by the variable node originating from the check node and a counting of the number of sign changes of an extrinsic information item is carried out on the global extrinsic information item.

11. The method according to claim 8, in which said correcting code is a low-density parity-check (LDPC) code.

12. The method according to claim 1, in which said correcting code is a turbo code, said iterative decoding algorithm includes using a first decoder and a second decoder configured to exchange with each other a first extrinsic information item and a second extrinsic information item, said criterion representing the number of oscillations being chosen to be equal to a number of sign changes, during all the successive iterations of said iterative decoding algorithm, of the extrinsic information item received by the second decoder or to the number of sign changes, during all the successive iterations of said iterative decoding algorithm, of the extrinsic information item received by the second decoder and of the extrinsic information item received by the first decoder or to a number of sign differences, during all the successive iterations of said iterative decoding algorithm, between the extrinsic information item received by the second decoder and the extrinsic information item received by the first decoder during one iteration or one half-iteration.

13. The method according to claim 1, in which said code word contains binary values and said modifying a value of one bit of said code word includes inverting the value of said one bit.

14. The method according to claim 1, in which said code word contains soft values and said modifying a value of one bit of said code word includes saturating the value of said one bit to a positive maximum saturation value and to a negative minimum saturation value respectively, to produce two modified code words.

15. The method according to claim 14, wherein:
simultaneously with the additional decoding step, for said each bit of said code word, a new step of producing a criterion representing the number of oscillations, during all the successive decoding iterations, of at least one extrinsic information item or of one extrinsic information item with regard to another extrinsic information item, is carried out,
the modifying a value of one bit of the code word and the decoding the modified code word are iterated while:
  i. preserving a modification or modifications of bit values resulting from previous iterations, and
  ii. modifying the value of the one bit of said code word for which said number of oscillations is highest in the additional decoding step carried out in a previous iteration; and
in which the iterations of the modifying the value of one bit of the code word and of decoding the modified code word are represented as a tree whose nodes each correspond to a decoding iteration associated with one of two saturation values from among a positive maximum value and a negative minimum value, said tree being traversed either width-wise or depth-wise.

16. The method according to claim 15, in which, when the decoding iteration associated with a node of said tree has converged, child nodes of said node are not traversed.

17. A system for receiving communications comprising:
a decoder device configured to:
- iteratively decode a code word of a correcting code using an iterative decoding algorithm, which for each bit of said code word, generates at least one extrinsic information item at each iteration,
- perform an initial step of decoding based upon said iterative decoding algorithm,
- simultaneously with an execution of said iterative decoding algorithm, for each bit of said code word, produce a criterion representing a number of oscillations, during all successive iterations of said iterative decoding algorithm, of at least one extrinsic information item or of one extrinsic information item with regard to another extrinsic information item,
- if the iterative decoding does not converge,
- modify, in said code word, only a value of the bit for which said number of oscillations is highest, to produce at least one modified code word,
- perform an additional decoding of said at least one modified code word based upon said iterative decoding algorithm, and
- output a decoded code word.

18. A tangible non-transitory processor-readable recording medium, on which a program is stored including instructions for executing an iterative decoding method by a processor of a decoding device, the instructions when executed by the processor cause the processor to:
- iteratively decode a code word of a correcting code using an iterative decoding algorithm, which for each bit of said code word, generates at least one extrinsic information item at each iteration,
- perform an initial step of decoding based upon said iterative decoding algorithm,
- simultaneously with an execution of said iterative decoding algorithm, for each bit of said code word, produce a criterion representing a number of oscillations, during all successive iterations of said iterative decoding algorithm, of at least one extrinsic information item or of one extrinsic information item with regard to another extrinsic information item,
- if the iterative decoding does not converge,
- modify, in said code word, only a value of the bit for which said number of oscillations is highest, to produce at least one modified code word,
- perform an additional decoding of said at least one modified code word based upon said iterative decoding algorithm, and
- output a decoded code word.

* * * * *